United States Patent [19]
Jang

[11] Patent Number: 5,972,779
[45] Date of Patent: Oct. 26, 1999

[54] METHOD FOR FORMING FIELD OXIDE FILM OF SEMICONDUCTOR DEVICE WITH SILICON AND NITROGEN CONTAINING ETCHING RESIDUE

[75] Inventor: Se Aug Jang, Kyoungki-do, Rep. of Korea

[73] Assignee: Hyundai Electronics Industries, Kyoungki-do, Rep. of Korea

[21] Appl. No.: 08/965,893

[22] Filed: Nov. 7, 1997

[30] Foreign Application Priority Data

Dec. 31, 1996 [KR] Rep. of Korea ............... 96-80220

[51] Int. Cl.$^6$ ............................................. H01L 21/762
[52] U.S. Cl. ......................... 438/452; 438/762; 438/770
[58] Field of Search ............................... 438/762, 763, 438/452, 770, 773

[56] References Cited

U.S. PATENT DOCUMENTS

| | | | |
|---|---|---|---|
| 4,584,205 | 4/1986 | Chen et al. | 427/93 |
| 4,912,062 | 3/1990 | Verma | 437/69 |
| 5,094,972 | 3/1992 | Pierce et al. | 437/67 |
| 5,244,823 | 9/1993 | Adan | 437/41 |
| 5,563,091 | 10/1996 | Lee | 437/70 |
| 5,637,528 | 6/1997 | Higashitani et al. | 438/452 |
| 5,786,277 | 7/1998 | Yamamoto | 438/770 |

FOREIGN PATENT DOCUMENTS

0 167 208 A2  1/1986  European Pat. Off. .

Primary Examiner—Olik Chaudhuri
Assistant Examiner—Daniel H. Mao
Attorney, Agent, or Firm—Thelen Reid & Priest, L.L.P.

[57] ABSTRACT

A field oxide formation method involving a primary field oxidation, which is carried out at a predetermined low temperature to form a field oxide film having a thickness smaller than a target thickness, and a secondary field oxidation, which is carried out at a higher temperature capable of relatively reducing the occurrence of a field thinning phenomenon, to form the remaining thickness portion of the target field oxide film. The field thinning phenomenon involved in a field oxidation is reduced. The characteristics of a finally produced gate oxide film is also improved. Consequently, the throughput and reliability of semiconductor devices having gate oxide films are improved.

11 Claims, 11 Drawing Sheets

| first oxidation | second oxidation | field oxide |
|---|---|---|
| 950°C 1000°A | 1100°C 2000°A | growth |
| 1000°C 1000°A | 1100°C 2000°A | growth |
| 1100°C 1000°A | 950°C 2000°A | ungrowth |
| 1100°C Nitrogen anneal 10min | 950°C 3000°A | ungrowth |
| 950°C Nitrogen anneal 30min | 950°C 3000°A | growth |

Fig. 10

METHOD FOR FORMING FIELD OXIDE FILM OF SEMICONDUCTOR DEVICE WITH SILICON AND NITROGEN CONTAINING ETCHING RESIDUE

BACKGROUND OF THE INVENTION

1. Field of the Invention

The present invention relates to a method for forming the field oxide film of a semiconductor device, and more particularly to a method for forming such a field oxide film, which uses different oxidation temperatures at initial and final stages of a field oxidation, thereby preventing a field oxide ungrowth phenomenon and a field thinning phenomenon while achieving an improvement in the characteristics of a finally produced gate oxide film.

2. Description of the Prior Art

A variety of field oxide film formation methods are known. An example of a conventional field oxide film formation method will be described in conjunction with FIGS. 1a to 1e.

FIGS. 1a to 1e illustrate sequential steps of a conventional field oxide film method in which a semiconductor substrate is recessed after the formation of nitride film spacers thereon to form a field oxide film, respectively.

Figure 1A:
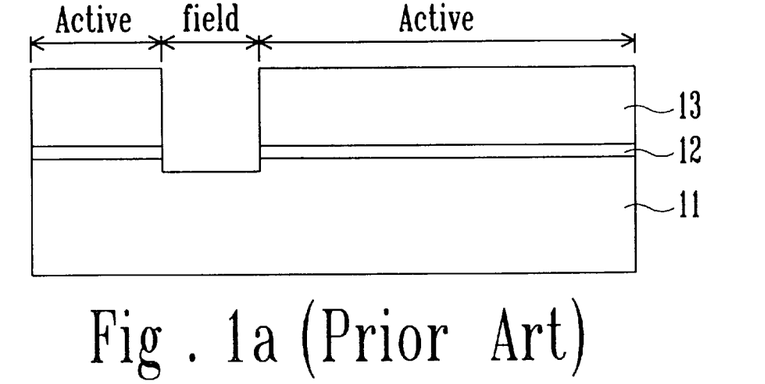
FIGS. 1a to 1e are sectional views respectively illustrating sequential steps of a conventional field oxide film method in which a semiconductor substrate is recessed after the formation of nitride film spacers thereon to form a field oxide film.
Figure 1B:
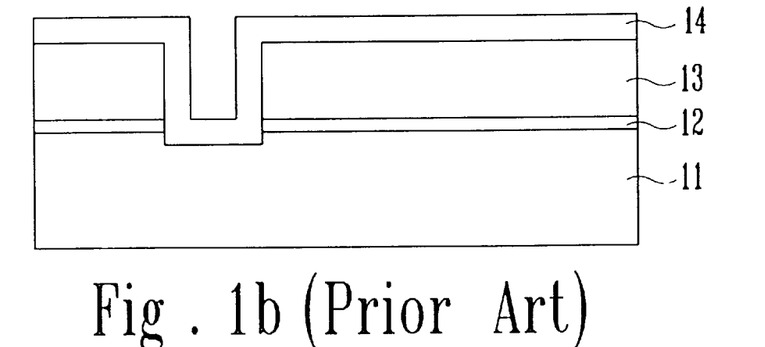
Figure 1C:
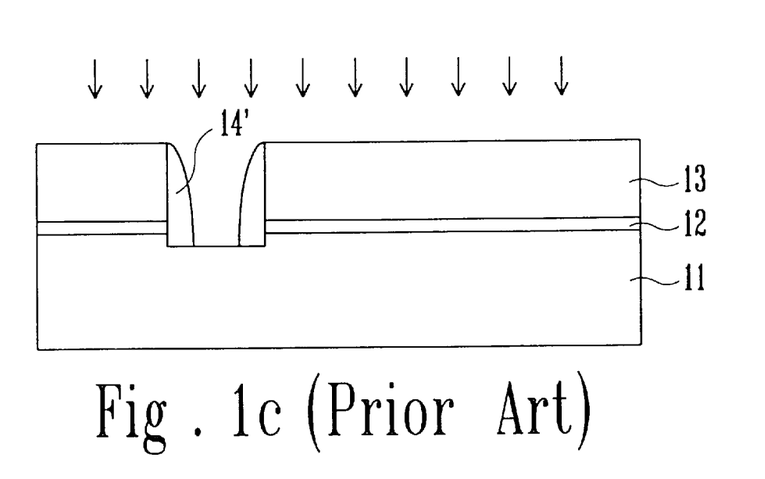
Figure 1D:
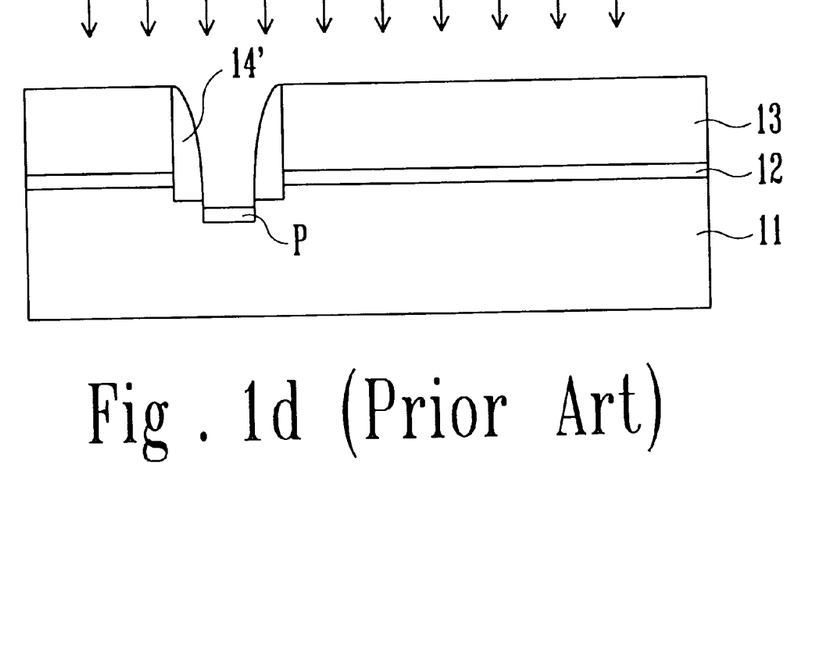

In accordance with this method, a nitride film 13 is first deposited over a semiconductor substrate 11 which has been formed with a pad oxide film 12, as shown in FIG. 1a. The nitride film 13 is then etched at its portion corresponding to a field region by use of an element isolation mask. The etching step is carried out in an overetching manner, so that the semiconductor substrate 11 is recessed to a certain depth, for example, a depth of 50 to 100 Å. Thereafter, a nitride film 14 is deposited over the entire exposed surface of the resulting structure, as shown in FIG. 1b. The nitride film 14 is then dry-etched without using any mask, thereby forming nitride film spacers 14' as shown in FIG. 1c. Using the nitride film spacers 14' as a mask, the exposed portion of the semiconductor substrate 11 between the nitride film spacers 14' is recessed by use of an etch process, thereby forming a hole having a desired depth in the semiconductor substrate 11, as shown in FIG. 1d.

At the silicon etching step for recessing the portion of the semiconductor substrate 11 corresponding to the field region, a portion of the nitride film 13 corresponding to an active region is also partially etched because the etch selectivity of silicon to the nitride film is finite. As a result, a polymer P containing silicon and nitrogen is formed in the hole of the semiconductor substrate 11. The formation of such a polymer is less generated in regions, such as cell regions of a memory device, where the area ratio a of the field region to the active region is relatively small. However, a large amount of polymer P is produced in peripheral circuit regions where the area ratio α of the field region to the active region is considerably large.

The polymer P formed during the recess silicon etching step is outwardly discharged or left in the hole or valley portion of the field region. In the field region associated with the peripheral circuit region, a relatively large amount of polymer is left on the bottom of the hole. Moreover, the polymer is not simply laid on the bottom of the hole, but embedded to a certain depth in the portion of the silicon substrate exposed in the hole. Accordingly, it is impossible to remove such a polymer using conventional wet cleaning methods.

Figure 1E:
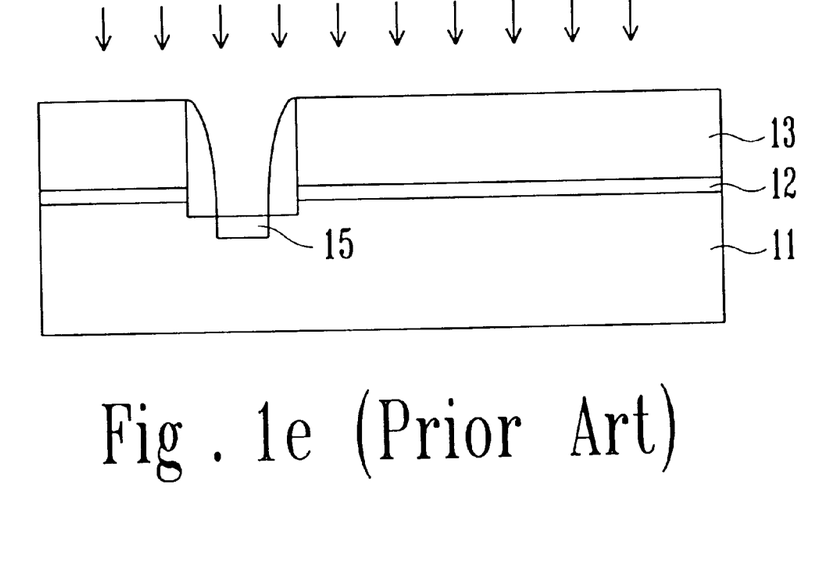

FIG. 1e illustrates a field oxide film formed in an incompletely grown (namely, ungrown) state when the field oxide film formation method of FIGS. 1a to 1d is used.

As shown in FIG. 1e, when a field oxidation is carried out at a temperature of 1,100° C. just after the processing step of FIG. 1d, namely, in a state in which the polymer P is left on the bottom of the hole in the field region, there is a problem in that a field oxide film is formed in an ungrown state. In FIG. 1e, the field oxide film is denoted by the reference numeral 15.

Figure 2:
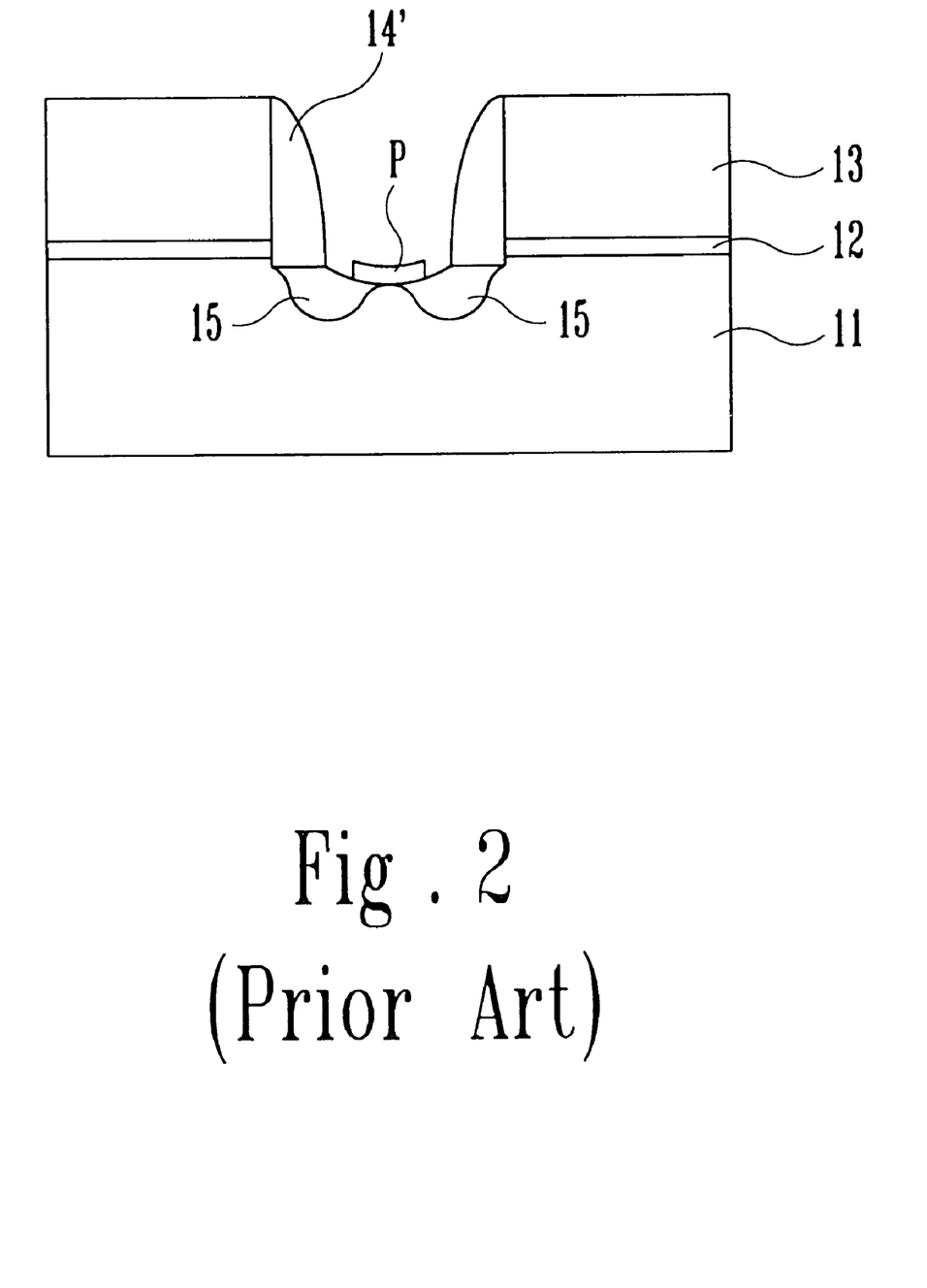
FIG. 2 is a sectional view illustrating a field oxide ungrowth phenomenon occurring in the conventional field oxidation.

In order to solve such a problem, various methods have been proposed. One method is illustrated in FIG. 2. In accordance with the method shown in FIG. 2, an additional dry etching step is carried out for the nitride film without using any mask after the etching step for recessing the semiconductor substrate 11, thereby removing the polymer P. When the wet field oxidation is carried out at a temperature of 1,100° C. after the additional dry etching step, a field oxide film is normally grown. Accordingly, the field oxide ungrowth is solved.

In this case, however, a long bird's beak is formed. In other words, the additional dry etching carried out to remove the polymer P also partially removes the nitride film spacers 14'. As a result, it is impossible to suppress a bird's beak penetration during the field oxidation. Due to the additional dry etching step, the manufacturing costs also increase.

Figure 3A:
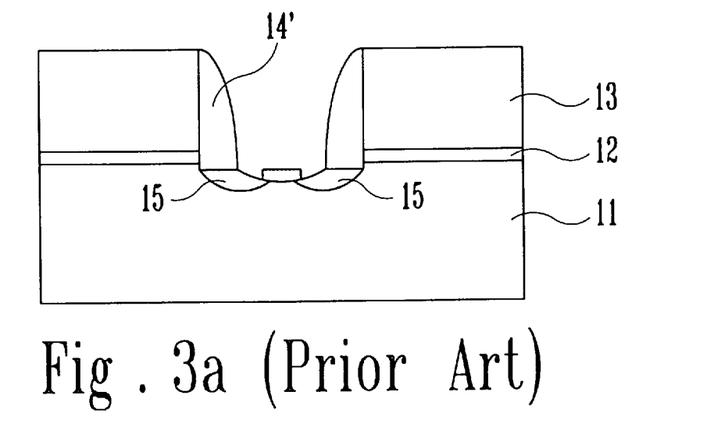
FIGS. 3a to 3e are sectional views respectively illustrating structures obtained by a wet field oxidation carried out at different oxidation temperatures after the processing step of FIG. 1d without carrying out an additional dry etching step for a nitride film.
Figure 3B:
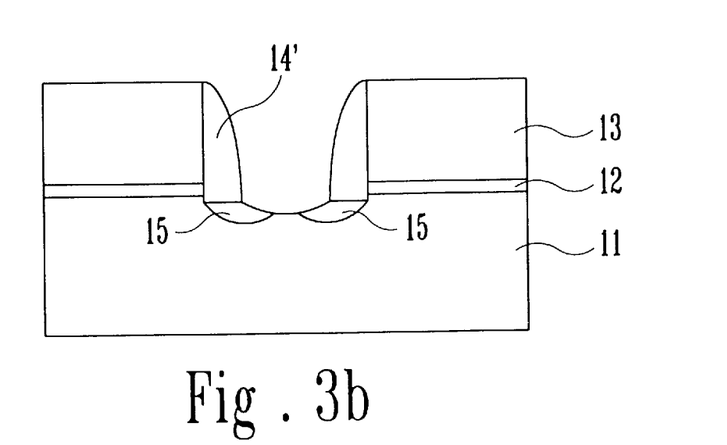
Figure 3C:
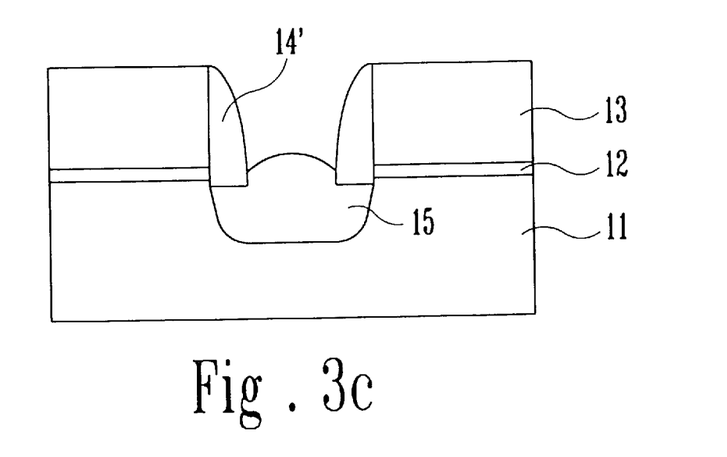
Figure 3D:
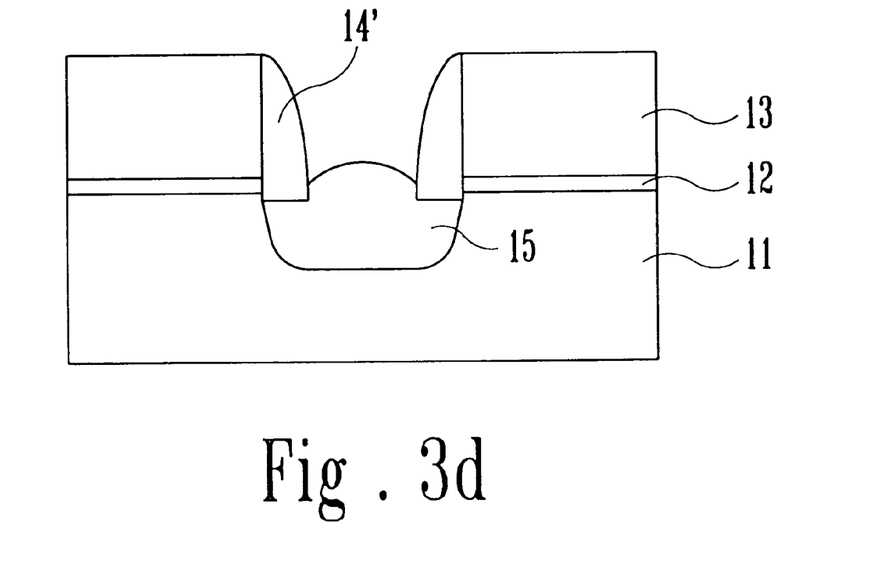
Figure 3E:
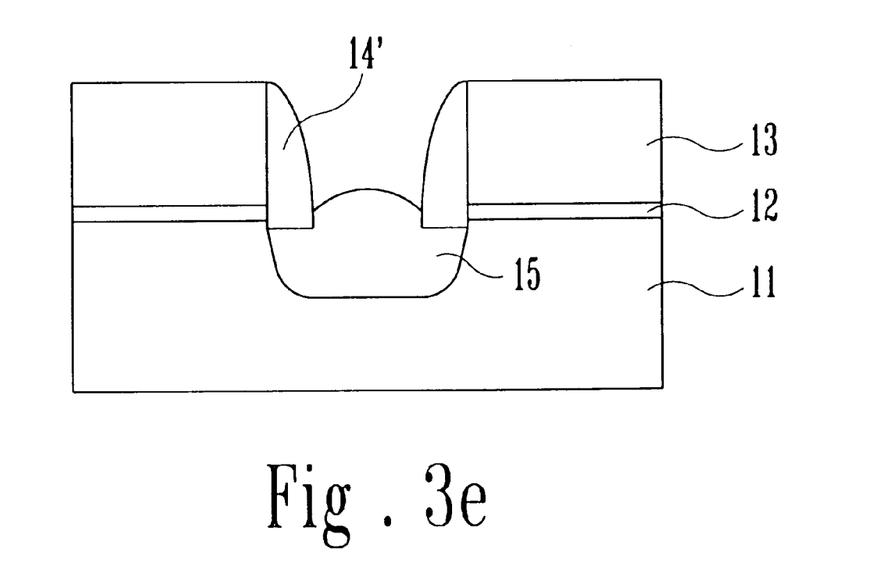

Another conventional method for solving the field oxide ungrowth problem is illustrated in FIGS. 3a to 3e. In accordance with this method, a wet field oxidation is carried out after the processing step of FIG. 1d without carrying out the above-mentioned additional dry etching step for the nitride film. FIG. 3a corresponds to the case in which the wet field oxidation is carried out at a temperature of 1,100° C., FIG. 3b shows the case in which the wet field oxidation is carried out at a temperature of 1,050° C., FIG. 3c shows the case in which the wet field oxidation is carried out at a temperature of 1,000° C., FIG. 3d shows the case in which the wet field oxidation is carried out at a temperature of 950° C., and FIG. 3e shows the case in which the wet field oxidation is carried out at a temperature of 900° C.

Referring to FIGS. 3a to 3e, it can be found that a field oxide ungrowth phenomenon occurs in the cases using a field oxidation temperature of 1,050° C. or above whereas a field oxide film 15 is normally grown at a field oxidation temperature of lower than 1,050° C.

This result shows that although the polymer P containing silicon and nitrogen is left after the processing step of FIG. 1d, a normal growth of the field oxide film is achieved when the field oxidation is carried out at a certain temperature or below. That is, although the polymer P is not a material serving as an oxidation barrier, it is thermally activated at a certain temperature or above, so that it is changed into a new, third material capable of serving as an oxidation barrier.

Accordingly, in accordance with the above-mentioned method, it is required to use a field oxidation temperature of 1,000° C. or below in order to change the polymer into a third material, thereby preventing the field oxide ungrowth phenomenon.

Figure 4:
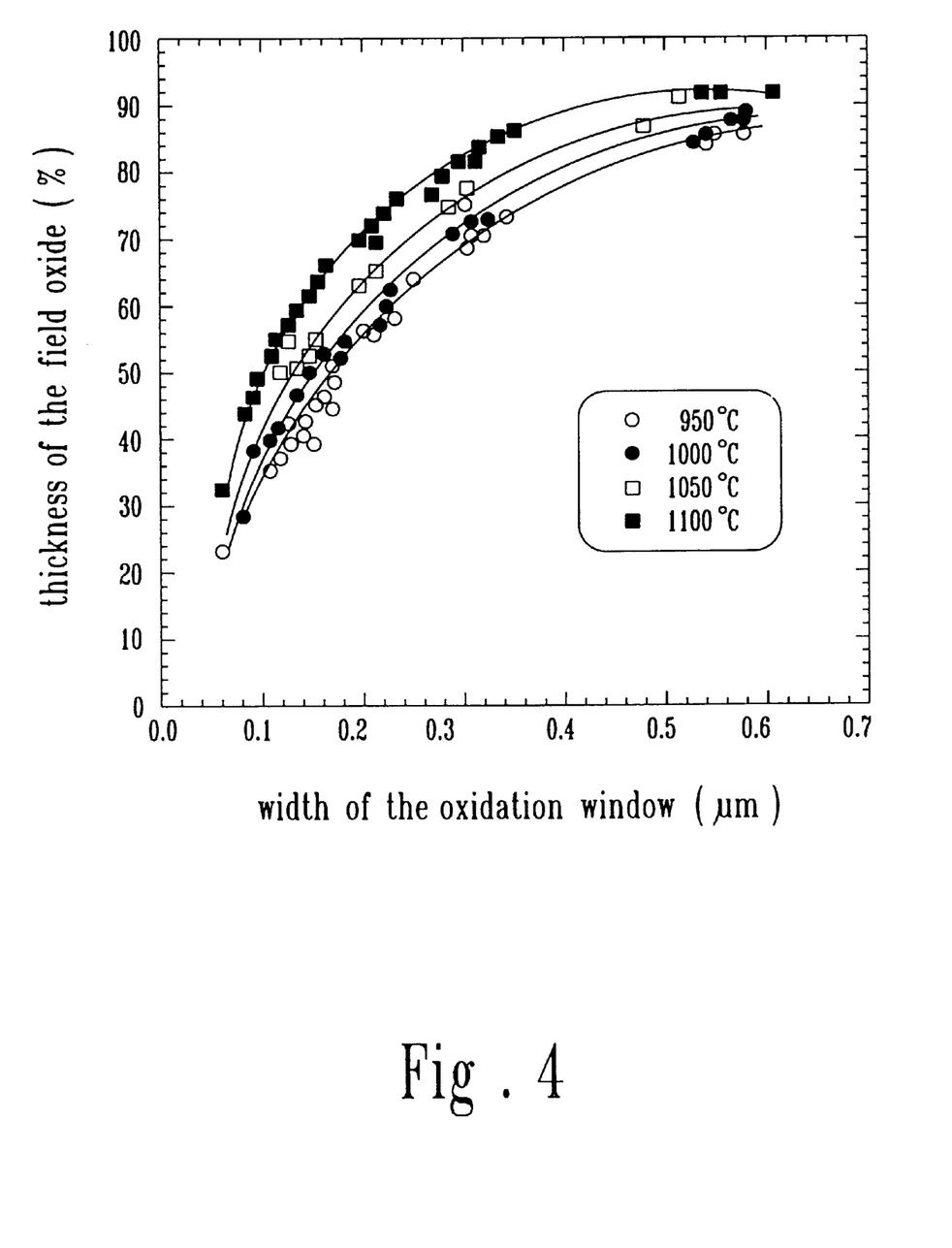
FIG. 4 is a graph illustrating data about a field thinning phenomenon occurring in the field oxide film structures according to the conventional methods of FIGS. 1a to 1e and FIG. 2, depending on the field oxidation temperature.

FIG. 4 illustrates data about a field thinning phenomenon occurring in the field oxide film structures according to the conventional methods of FIGS. 1a to 1e and FIG. 2, depending on the field oxidation temperature. The field thinning phenomenon is a phenomenon wherein the field oxide film has a reduced thickness in a narrow field region as compared to a wide field region.

It is known that such a field thinning phenomenon is mainly caused by stress accumulated in the field oxide film. Accordingly, the stress existing in the field oxide film should be relieved in order to suppress the field thinning phenomenon. The field oxidation temperature is an important parameter associated with the relief of stress.

Referring to FIG. 4, it can be found that the field thinning phenomenon is more remarkably generated at a lower field oxidation temperature. This is because it is difficult to relieve the stress existing in the field oxide film due to an increased viscosity of the field oxide at a low temperature. For example, in the case using an oxidation window width of 0.20 $\mu$m, the thickness of the field oxide film formed at the field oxidation temperature of 1,100° C. is smaller than that at the field oxidation temperature of 950° C. by about 15%.

Consequently, the conventional method involves a problem in that the field oxide film has a reduced thickness in a narrow oxidation window region when a field oxidation temperature of 1,000° C. or below is used, even though it is possible to prevent a field oxide ungrowth at the field oxidation temperature. Where a thin field oxide film is formed, a serious problem associated with an electrical punchthrough phenomenon occurs.

Figure 5A:
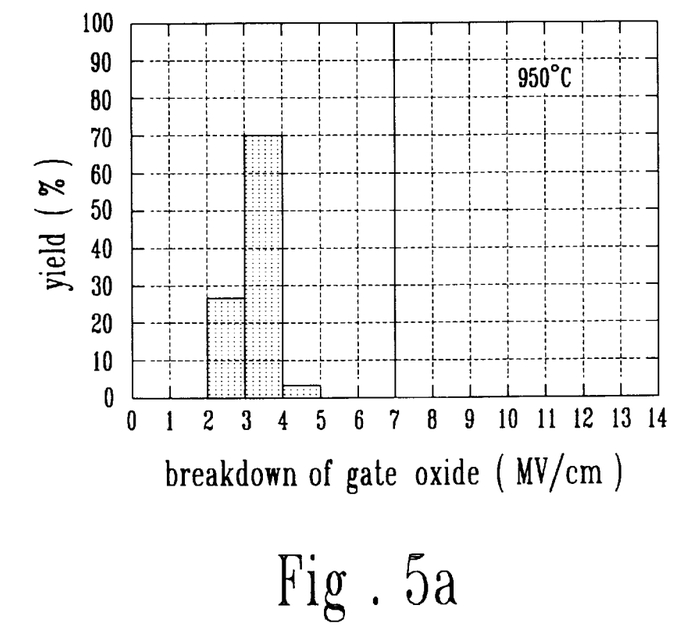
FIGS. 5a and 5b are graphs respectively illustrating test data about the reliability of gate oxide films respectively formed in accordance with the conventional method of FIGS. 1a to 1e or FIG. 2 at different field oxidation temperatures.
Figure 5B:
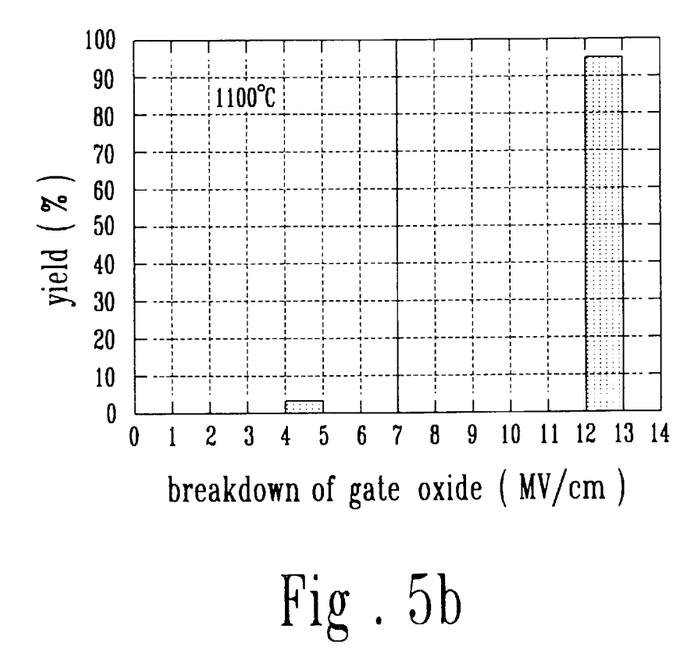

FIGS. 5a and 5b are graphs respectively illustrating test data about characteristics of gate oxide films respectively formed in accordance with the conventional method of FIGS. 1a to 1e or FIG. 2 at different field oxidation temperatures of 950° C. and 1,100° C.

Referring to FIGS. 5a and 5b, it can be found that the gate oxide film formed at a field oxidation temperature of 950° C. exhibits a degradation in the characteristics thereof whereas the gate oxide film formed at a field oxidation temperature of 1,100° C. exhibits superior characteristics. Such results are based on the fact that when a field oxide film is grown at a low field oxidation temperature, it is difficult to relieve the stress existing in the field oxide film due to an increased viscosity of the field oxide, thereby causing the semiconductor substrate to be greatly stressed. Consequently, it is understood that a higher field oxidation temperature is advantageous in terms of the field thinning phenomenon and the characteristics of the gate oxide film.

SUMMARY OF THE INVENTION

Therefore, an object of the invention is to provide a method for forming a field oxide film of a semiconductor device, wherein a field oxidation is carried out in such a manner that its initial stage is carried out a low temperature capable of preventing a nitride-based polymer from being changed into a third material serving as an oxidation barrier while its subsequent stage is carried out at a higher temperature capable of relatively suppressing a field oxidation phenomenon, thereby solving the field oxide ungrowth phenomenon, field thinning phenomenon and oxide degradation without using any additional nitride film etching.

In accordance with the present invention, this object is accomplished by providing a method for forming a field oxide film of a semiconductor device, comprising the steps of: sequentially forming a pad oxide film and a nitride film over a semiconductor substrate; etching portions of the nitride film and pad oxide film respectively corresponding to a field region; forming nitride film spacers on opposite side walls of the etched nitride film and pad oxide film, respectively; recessing an exposed portion of the semiconductor substrate between the nitride film spacers to a desired depth; primarily oxidizing the exposed portion of the semiconductor substrate at a low temperature of 1,000° C. or below, thereby forming a first field oxide film on the exposed portion of the semiconductor substrate; and secondarily oxidizing the semiconductor substrate at a higher temperature of 1,050° C. or above, thereby forming a second field oxide film on the first field oxide film.

Preferably, the primary field oxidation is carried out at a temperature of 900 to 1,000° C. whereas the secondary field oxidation is carried out at a temperature of 1,050 to 1,200° C.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

FIGS. 6a to 6e illustrate sequential steps of a method for forming a field oxide film in accordance with the present invention, respectively.

Figure 6A:
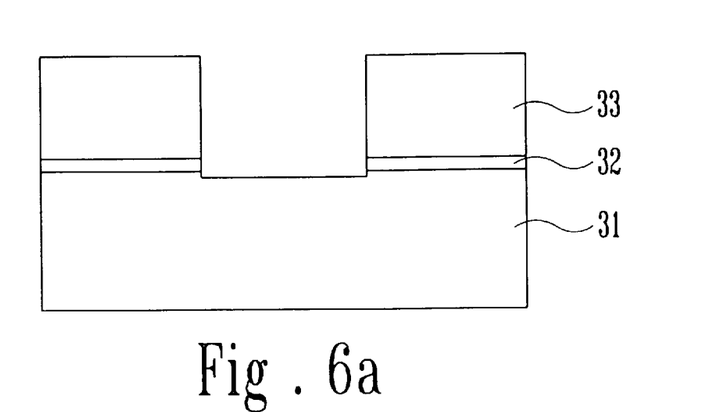
FIGS. 6a to 6e are sectional views respectively illustrating sequential steps of a method for forming a field oxide film in accordance with the present invention.

In accordance with the method of the present invention, a semiconductor substrate 31 is first oxidized, thereby forming a pad oxide film 32 thereover, as shown in FIG. 6a. A nitride film 33 is then formed to a desired thickness over the pad oxide film 32. The nitride film 33 is subsequently etched in accordance with a photoetching process so as to remove a portion of the nitride film 33 corresponding to a field region.

The etching step is carried out in an overetching manner, so that the semiconductor substrate 31 is recessed to a desired depth, for example, a depth of 50 to 100 Å.

Figure 6B:
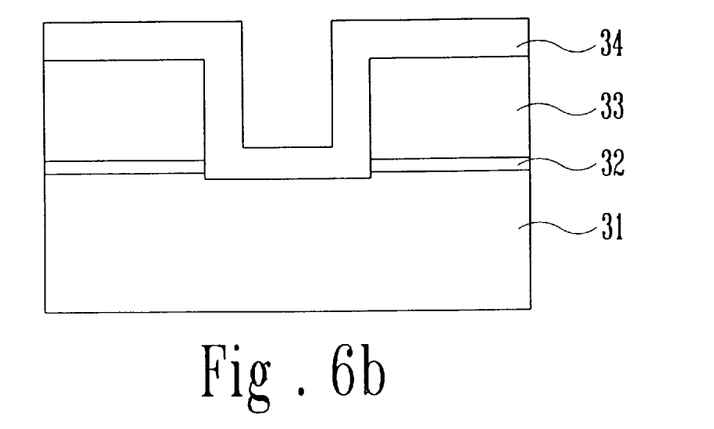

Thereafter, a nitride film 34 is deposited over the entire exposed surface of the resulting structure in order to form spacers, as shown in FIG. 6b.

Figure 6C:
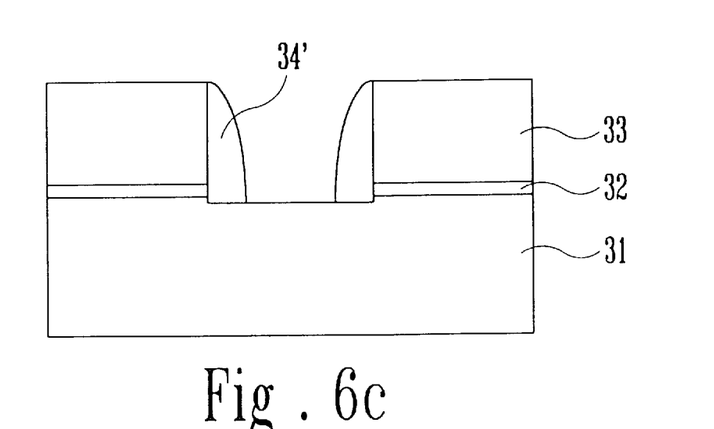

The nitride film 34 is then dry-etched at the whole surface thereof without using any mask, thereby forming nitride film spacers 34' as shown in FIG. 6c.

Figure 6D:
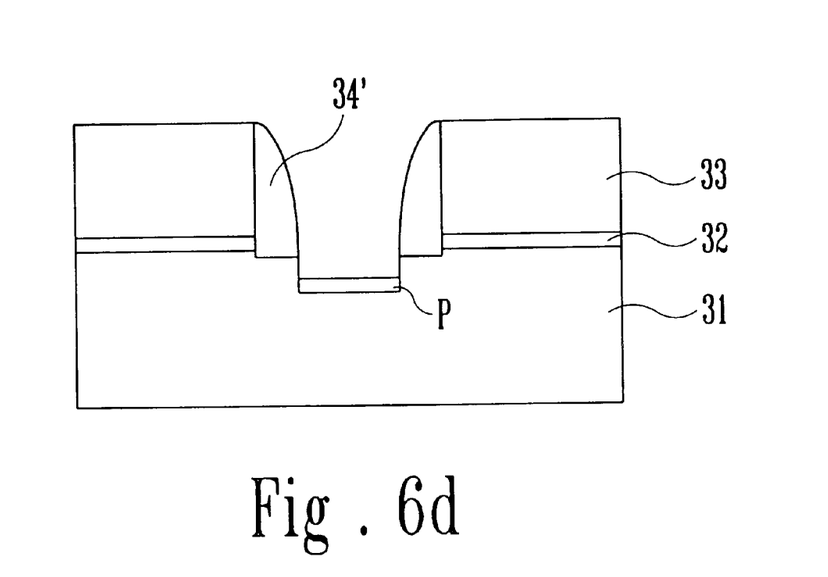

Using the nitride film spacers 34' as an etch barrier, the exposed portion of the semiconductor substrate 31 between the nitride film spacers 34' is recessed by use of an etch process, thereby forming a hole having a desired depth in the semiconductor substrate 31, as shown in FIG. 6d. At this time, a polymer P containing silicon and nitrogen is formed in the field region, in particular, the hole of the semiconductor substrate 31.

Figure 6E:
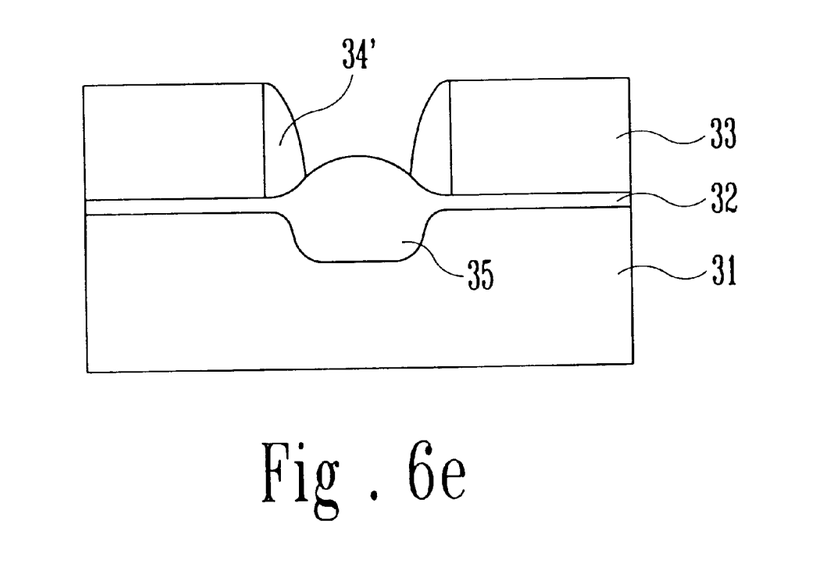

Thereafter, a field oxidation is carried out, thereby forming a field oxide film 35, as shown in FIG. 6e.

Figure 7:
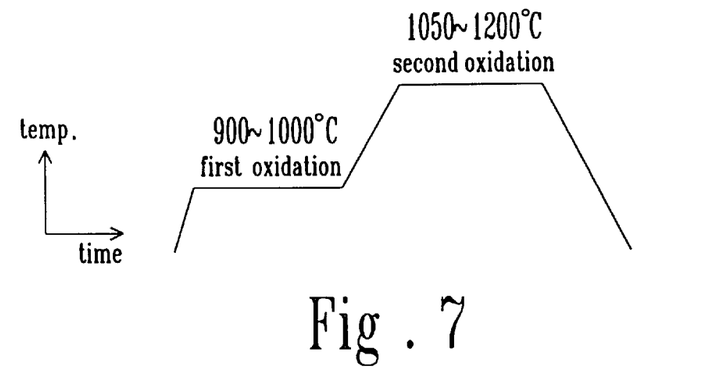
FIG. 7 is a diagram illustrating an oxidation recipe for growing a field oxide film in accordance with the present invention.

FIG. 7 is a diagram illustrating the field oxidation condition in the formation of the field oxide film according to the present invention.

As shown in FIG. 7, the field oxidation involves a primary field oxidation carried out at a relatively low temperature of 900 to 1,000° C. and a secondary field oxidation carried out at a higher temperature of 1,050 to 1,200° C. The target thickness of the field oxide film is about 3,000 Å.

The primary field oxidation carried out at a temperature of 900 to 1,000° C. is adapted to bury the polymer P in a primary field oxide film formed by the primary field oxidation without a change of the polymer P into an oxidation barrier material, so that the polymer P provides an oxidation path during the secondary field oxidation.

The secondary field oxidation carried out at a higher temperature is adapted to suppress a field thinning phenomenon while achieving an improvement in the characteristics of a gate oxide film finally obtained.

Where the secondary field oxidation is carried out in a dry oxidation manner, the oxidation time is lengthened. In this case, a further improvement in the field thinning phenomenon is obtained.

The formation of the primary and secondary field oxide films is carried out in accordance with a single oxidation recipe or in accordance with independent recipes, respectively.

In addition to the oxidation temperature, the stress relief time is a parameter associated with the field thinning phenomenon. That is, when a sufficient stress relief time is given under the condition in which the oxidation temperature is constant, a further improvement in the field thinning phenomenon is obtained.

Figure 8:
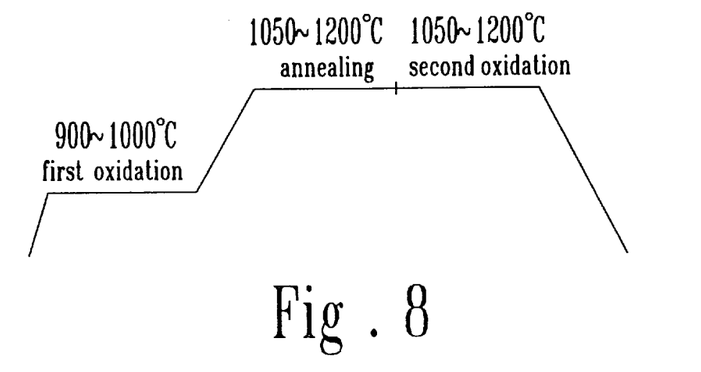
FIG. 8 is a diagram illustrating another oxidation recipe for growing a field oxide film in accordance with the present invention.

FIG. 8 is a diagram illustrating another oxidation recipe associated with the field oxidation of FIG. 6e.

As shown in FIG. 8, in order to obtain a field oxide film having a target thickness of 3,000 Å, a primary field oxidation is carried out at a temperature of 900 to 1,000° C., thereby forming a primary field oxide film having a thickness of about 500 to 1,000 Å. The primary field oxidation is adapted to solve a field oxide ungrowth phenomenon.

A secondary field oxidation is then carried out at a higher temperature of 1,050° C. or above. Prior to this secondary field oxidation, an annealing process is carried out for about 30 minutes in a pure nitrogen or argon atmosphere in order to relieve stress existing in the primary field oxide film. By virtue of the secondary field oxidation carried out at a temperature of 1,050° C. or above, an improvement in the field thinning phenomenon is obtained.

Figure 9:
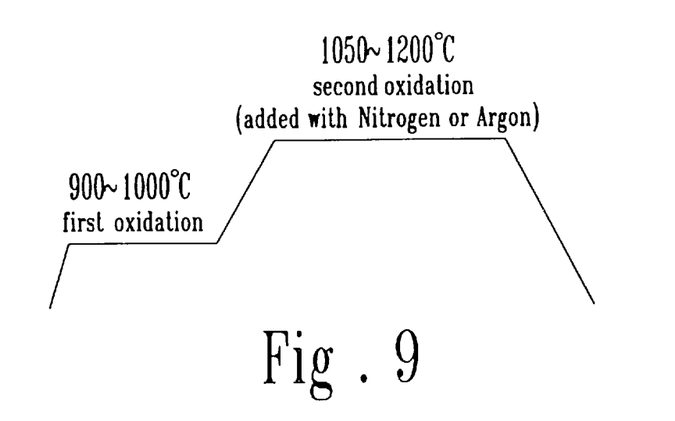
FIG. 9 is a diagram illustrating another oxidation recipe for growing a field oxide film in accordance with the present invention.

FIG. 9 is a diagram illustrating another oxidation recipe associated with the field oxidation of FIG. 6e.

As shown in FIG. 9, in order to obtain a field oxide film having a target thickness of 3,000 Å, a primary field oxidation is carried out at a temperature of 900 to 1,000° C. The primary field oxidation is adapted to solve a field oxide ungrowth phenomenon.

A secondary field oxidation is then carried out at a higher temperature of 1,100° C. or above in an oxidation atmosphere added with nitrogen or argon, thereby forming a secondary field oxide film. The reason why nitrogen or argon is added to the oxidation atmosphere used for the second field oxidation is to sufficiently reduce the stress relief time, thereby improving the field thinning phenomenon.

In addition to the above-mentioned structure to which the present invention is applied, the above-mentioned field oxide ungrowth phenomenon always occurs in a structure including a semiconductor substrate basically having a LOCOS (Local Oxidation of Silicon) while being recessed to a certain depth. Accordingly, the field oxidation method of the present invention can be applied to any silicon-recessed structure, in addition to the above-mentioned structure.

Figure 10:
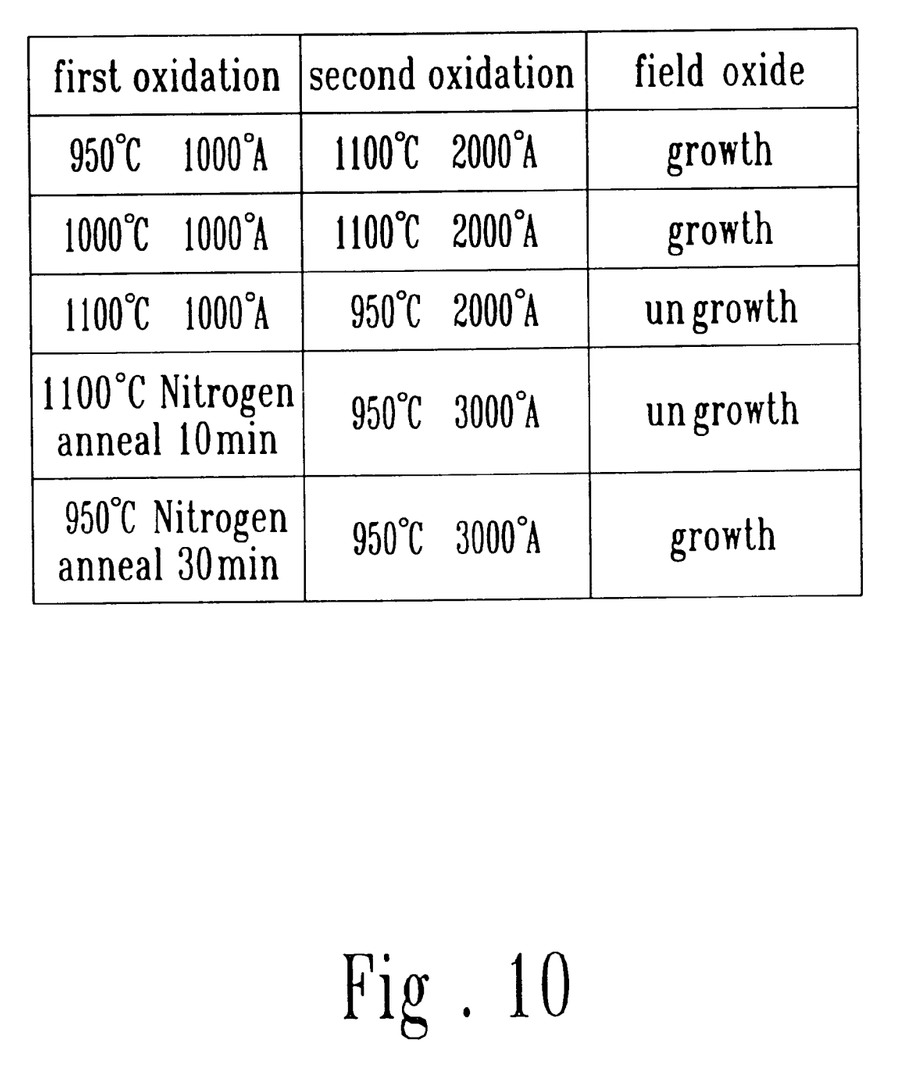
FIG. 10 is a table illustrating results respectively obtained after testing a field oxide ungrowth phenomenon at various primary and secondary field oxidation conditions.

FIG. 10 is a table illustrating results respectively obtained after testing a field oxide ungrowth phenomenon at various primary and secondary field oxidation conditions.

Referring to FIG. 10, it can be found that a normal field oxide growth is obtained when the primary field oxidation is carried out at a temperature of 1,000° C. or below. It can also be found that a field oxide ungrowth occurs when the primary field oxidation is carried out at a temperature of 1,050° C. or above.

As apparent from the above description, the present invention provides a field oxide formation method involving a primary field oxidation, which is carried out at a predetermined low temperature to form a field oxide film having a thickness smaller than a target thickness, and a secondary field oxidation, which is carried out at a higher temperature capable of relatively reducing the occurrence of a field thinning phenomenon and improving the characteristics of a finally produced gate oxide film, to form the remaining thickness portion of the target field oxide film. Once a primary field oxide film having a certain thickness is formed at a low temperature, a polymer formed in the field region is buried in the primary field oxide film. The polymer serves as an oxidation path in the secondary field oxidation. Accordingly, even when a third material serving as an oxidation barrier is formed during the secondary field oxidation carried out at a high temperature, there is no field oxide ungrowth phenomenon. The field oxide formation method does not involve an additional nitride film etching after recessing the silicon substrate. Accordingly, the whole process is simplified.

Since no additional nitride film etching is carried out, there is no loss of the nitride film and nitride film spacers. Accordingly, the length of a bird's beak formed can be reduced. The field thinning phenomenon involved in a low-temperature field oxidation is also reduced. Consequently, the throughput and reliability of semiconductor devices having gate oxide films are improved.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a field oxide film of a semiconductor device, comprising the steps of:

sequentially forming a pad oxide film and a nitride film over a semiconductor substrate;

etching portions of the nitride film and pad oxide film respectively corresponding to a field region;

forming nitride film spacers on opposite side walls of the etched nitride film and pad oxide film, respectively;

recessing an exposed portion of the semiconductor substrate between the nitride film spacers to a desired depth;

primarily oxidizing the exposed portion of the semiconductor substrate at a low temperature of not higher than 1,000° C., thereby forming a first field oxide film on the exposed portion of the semiconductor substrate; and secondarily oxidizing the semiconductor substrate at a higher temperature of not lower than 1,050° C., thereby forming a second field oxide film on the first field oxide film.

2. The method in accordance with claim 1, wherein the primary and secondary field oxidation steps are carried out in accordance with a single oxidation recipe.

3. The method in accordance with claim 1, wherein the primary and secondary field oxidation steps are carried out in accordance with two independent recipes, respectively.

4. The method in accordance with claim 1, wherein the first and second field oxide films have a thickness ratio of 1:2.

5. The method in accordance with claim 1, wherein the primary field oxidation step is carried out at a temperature of 900 to 1,000° C.

6. The method in accordance with claim 1, wherein the secondary field oxidation step is carried out at a temperature of 1,050 to 1,200° C.

7. The method in accordance with claim 1, further comprising the step of:

annealing the structure obtained after the formation of the first field oxide film, prior to the secondary field oxidation step.

8. The method in accordance with claim 7, wherein the annealing step is carried out at a temperature of 1,050 to 1,200° C. in a nitrogen or argon atmosphere.

9. The method in accordance with claim 7, wherein the annealing step is carried out for 20 to 30 minutes.

10. The method in accordance with claim 1, wherein the secondary field oxidation step is carried out in an oxidation atmosphere added with nitrogen or argon so as to obtain a reduced oxidation rate.

11. The method in accordance with claim 1, wherein the secondary field oxidation step is carried out in a wet oxidation manner.

* * * * *